(12) United States Patent
Sitarski et al.

(10) Patent No.: US 8,872,676 B2
(45) Date of Patent: Oct. 28, 2014

(54) SYSTEMS AND METHODS FOR SWITCHING

(75) Inventors: Nicholas Scott Sitarski, Ypsilanti, MI (US); William Patrick Garrett, Plymouth, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 306 days.

(21) Appl. No.: 13/279,667

(22) Filed: Oct. 24, 2011

(65) Prior Publication Data

US 2013/0033356 A1 Feb. 7, 2013

Related U.S. Application Data

(60) Provisional application No. 61/513,799, filed on Aug. 1, 2011.

(51) Int. Cl.
| | | |
|---|---|---|
| *H03K 5/1254* | (2006.01) | |
| *G06F 13/42* | (2006.01) | |
| *H03K 17/96* | (2006.01) | |
| *H03K 5/1252* | (2006.01) | |
| *H03M 11/10* | (2006.01) | |

(52) U.S. Cl.
CPC .............. *G06F 13/42* (2013.01); *H03K 5/1254* (2013.01); *H03K 17/962* (2013.01); *H03K 5/1252* (2013.01); *H01H 2300/054* (2013.01); *H03M 11/10* (2013.01)
USPC .............. 341/24; 200/600; 307/112; 340/1.1; 341/26; 400/479.1

(58) Field of Classification Search
CPC ............ H01H 2300/054; H03M 11/10; H03K 5/1252; H03K 5/1254; H03K 17/962
USPC .......... 200/600; 400/479.1; 307/112; 340/1.1
See application file for complete search history.

(56) References Cited

U.S. PATENT DOCUMENTS

| | | | |
|---|---|---|---|
| 4,028,560 A | 6/1977 | Bainter | |
| 4,523,104 A | 6/1985 | Norris et al. | |
| 4,853,685 A | 8/1989 | Vogt | |
| 4,956,637 A | 9/1990 | Vogt | |
| 5,315,539 A | 5/1994 | Hawes | |
| 5,783,874 A * | 7/1998 | Gaglione et al. | 307/113 |
| 7,453,376 B2 * | 11/2008 | de Brebisson | 341/24 |
| 7,579,894 B2 | 8/2009 | Kejriwal | |
| 7,847,614 B2 | 12/2010 | Taylor | |
| 8,076,949 B1 * | 12/2011 | Best et al. | 324/663 |
| 2006/0076984 A1 | 4/2006 | Lu et al. | |
| 2009/0303088 A1 | 12/2009 | Vile et al. | |
| 2012/0217147 A1 * | 8/2012 | Porter et al. | 200/600 |

* cited by examiner

*Primary Examiner* — Daniel Wu
*Assistant Examiner* — Benyam Haile
(74) *Attorney, Agent, or Firm* — Dinsmore & Shohl LLP

(57) ABSTRACT

In one embodiment, a capacitive switching system may include a plurality of capacitive switches and at least one processor. Each of the capacitive switches may include an activation surface offset from an energized conductor by a dielectric region and a capacitance that is dependent upon an electric field generated by the energized conductor. The at least one processor may execute machine readable instructions to transform a change in the capacitance of one of the capacitive switches into a first control signal indicative of a first active state. A rejection delay may be activated by the at least one processor after the change in the capacitance of the one of the capacitive switches. The rejection delay can remain activated for a predetermined time period. A second control signal may be prevented from indicating a second active state while the rejection delay is activated.

16 Claims, 6 Drawing Sheets

SYSTEMS AND METHODS FOR SWITCHING

CROSS-REFERENCE TO RELATED APPLICATIONS

This application claims the benefit of U.S. Provisional Application No. 61/513,799, filed Aug. 1, 2011, entitled "SYSTEMS & METHODS FOR SWITCHING." The entire content of said application is hereby incorporated by reference.

TECHNICAL FIELD

The present specification generally relates to systems and methods for switching and, more specifically, to systems and methods for capacitive switching.

BACKGROUND

As background, electrical switches may operate by bringing contacts made of flexible, conductive materials into contact when actuated (i.e., activated by a user). When the contacts are brought together mechanically, the contacts alter an electrical circuit to generate a signal (e.g., a voltage or current). However, the mechanical interaction (i.e., momentum and elasticity) may be oscillatory as the contacts are brought together. Specifically, the contacts may initially oscillate between various states of mechanical coupling to generate a noisy signal. Capacitive switches are an alternative to mechanically actuated electrical switches. However, capacitive switches are actuated by altering the capacitance of the switch to generate a signal, and may experience capacitive oscillations analogous to the mechanical oscillations of mechanically actuated electrical switches.

The oscillations of the switch affect the signal produced by the switch and cause "bounce." Bounce is commonly described as a rapidly pulsed electric signal instead of a clean transition from zero (i.e., no signal) to full signal. Bounce may be mitigated (i.e., "debounced") by collecting multiple samples of the actuated state that are sufficient to allow the oscillations to settle to a steady state condition. Some automobiles include a plurality of debounced switches in close proximity to one another. In some circumstances, a user may actuate a first debounced switch intentionally and a second debounced switch unintentionally. However, debouncing may not be effective to prevent the unintentionally actuated switch from causing a device or function controlled by the unintentionally actuated switch from performing an undesired action.

Accordingly, a need exists for alternative systems and methods of capacitive switching.

SUMMARY

In one embodiment, a capacitive switching system may include a plurality of capacitive switches and at least one processor. Each of the capacitive switches may include an activation surface offset from an energized conductor by a dielectric region and a capacitance that is dependent upon an electric field generated by the energized conductor. The at least one processor may be in electrical communication with the capacitive switches. The at least one processor may execute machine readable instructions to transform a change in the capacitance of one of the capacitive switches into a first control signal indicative of a first active state. A rejection delay may be activated by the at least one processor after the change in the capacitance of the one of the capacitive switches. The rejection delay can remain activated for a predetermined time period. A second control signal may be prevented from indicating a second active state while the rejection delay is activated, and the second control signal corresponds to another of the capacitive switches.

In another embodiment, a method for applying a rejection delay may include detecting, automatically with at least one processor, a capacitance of each of a plurality of capacitive switches. Each of the capacitive switches may include an activation surface offset from an energized conductor by a dielectric region such that the capacitance is dependent upon the energized conductor. A change in the capacitance of one of the capacitive switches can be transformed into a first control signal indicative of a first active state. The rejection delay can be activated after the change in the capacitance of the one of the capacitive switches. The rejection delay can remain activated for a predetermined time period. A second control signal can be prevented from indicating a second active state while the rejection delay is activated. The second control signal corresponds to another of the capacitive switches.

In yet another embodiment, a switching system may include a first switch, a second switch, and at least one processor. The first switch can generate a first signal indicative of the actuation of the first switch. The second switch can generate a second signal indicative of the actuation of the second switch. The at least one processor can be in electrical communication with the first switch and the second switch. The at least one processor can execute machine readable instructions to transform the signal of the first switch into a first control signal having a first active state and a first inactive state. The first control signal can be in the first active state when the first signal of the first switch is within a first activation range. The first control signal can be in the first inactive state when the first signal of the first switch is outside of the first activation range. A rejection delay can be activated by the at least one processor when the first signal of the first switch transitions from being outside of the first activation range to being within the first activation range. The rejection delay can be deactivated by the at least one processor a predetermined time period after the rejection delay was activated. The second signal of the second switch can be transformed by the at least one processor into a second control signal having a second active state and a second inactive state. The second control signal can be in the second active state when the second signal of the second switch is within a second activation range and the rejection delay is deactivated. The second control signal can be in the second inactive state when the second signal of the second switch is outside of the first activation range and when the rejection delay is activated.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
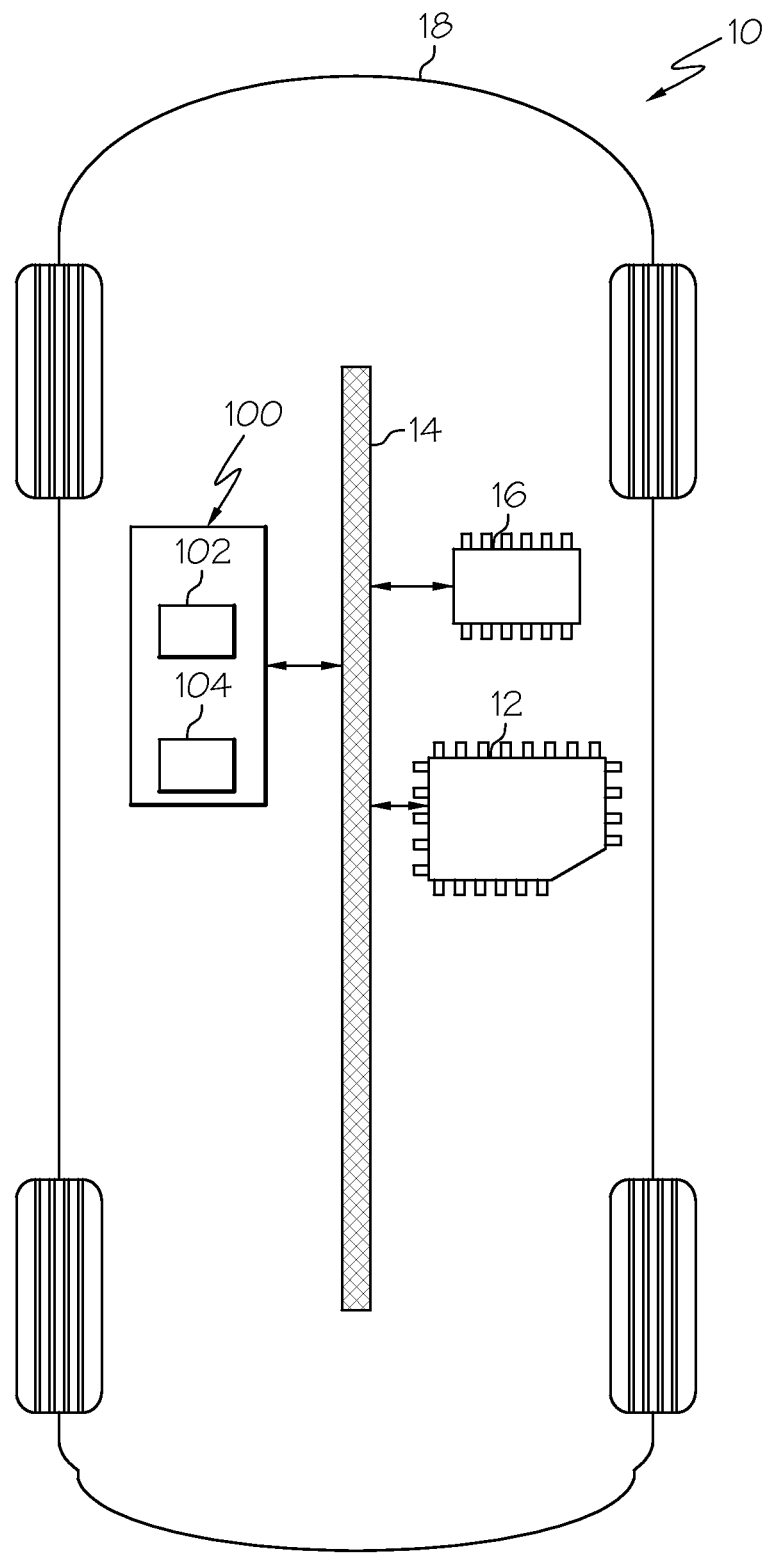
FIG. 1 schematically depicts a capacitive switching system according to one or more embodiments shown and described herein.

FIG. 1 generally depicts one embodiment of a switching system for generating control signals that control devices communicably coupled to the switching system. The switching system comprises a plurality of switches communicably coupled to at least one processor. Various embodiments of the switching system and methods for operating the switching system will be described in more detail herein.

Referring now to FIG. 1, a capacitive switching system 10 located in a vehicle 18 is schematically depicted. The capacitive switching system 10 comprises a plurality of capacitive switches 100, including a first capacitive switch 102 and a second capacitive switch 104. The capacitive switches 100 may include any sensor that measures capacitance. Accordingly, each of the capacitive switches 100 is a device that measures capacitance and converts it into a signal that is correlated to the measured value of the capacitance. It is noted that the term "signal" means a waveform (e.g., electrical, optical, magnetic, or electromagnetic waveforms), such as DC, AC, sinusoidal-wave, triangular-wave, square-wave, and the like, capable of traveling through a medium.

Figure 2:
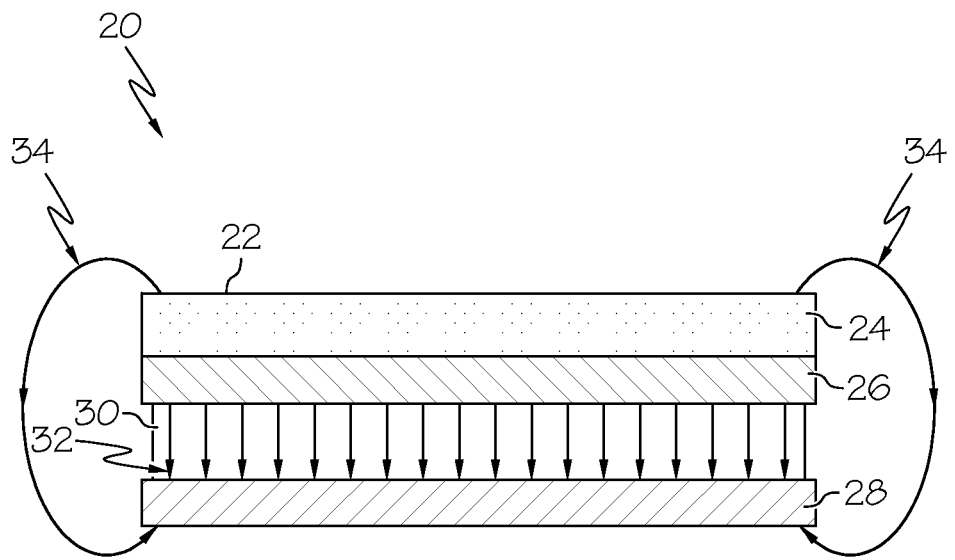
FIG. 2 schematically depicts a capacitive switch according to one or more embodiments shown and described herein.

Referring now to FIG. 2, an embodiment of a capacitive switch 20 is depicted. The capacitive switch 20 comprises an activation surface 22 for receiving user input. The activation surface 22 is offset from an energized conductor 26 by a dielectric region 24. The capacitive switch 20 may optionally comprise a second conductor 28 that is offset from the energized conductor 26 by a second dielectric region 30. The energized conductor 26 and the second conductor 28 may comprise any conductive material having free electrons such as, for example, copper, aluminum, tin, carbon, lead, silver, gold and the like. It is noted that, while the energized conductor 26 and the second conductor 28 are depicted in FIG. 2 as parallel plates, the energized conductor 26 and the second conductor 28 may be formed from wire or shaped conductive traces. Furthermore, it is noted that the activation surface 22, the dielectric region 24, and/or the second dielectric region 30 may comprise any dielectric material such as, for example, ceramic, cotton paper, polyethylene, glass, plastic, polytetrafluoroethylene, epoxy, polyester and the like. Moreover, the activation surface 22 may also comprise a printed graphic.

Referring again to FIG. 1, the capacitive switching system 10 comprises at least one processor 12 communicably coupled with the capacitive switches 100. The at least one processor 12 executes machine readable instructions to transform a signal that is correlated to a capacitance of the capacitive switches 100 into a control signal. The at least one processor 12 may be an integrated circuit, a microprocessor, microchip, a computer, or any other computing device capable of executing machine readable instructions. The machine readable instructions may be stored in a memory 16. The memory 16 may comprise RAM, ROM, a flash memory, a hard drive, a register or any device capable of storing machine readable instructions.

It is noted that, while the at least one processor 12, the capacitive switches 100, and the memory 16 are depicted in FIG. 1 as discrete components communicatively coupled with one another, additional processors and additional memories may be integral with any of the at least one processor 12, the capacitive switches 100, and the memory 16 without departing from the scope of the present disclosure. Specifically, the capacitive switches 100 may include processors and memories for performing any portion of the machine readable instructions described herein. Furthermore, it is noted that the phrase "communicatively coupled," as used herein, means that components are capable of exchanging data signals with one another such as, for example, electrical signals via conductive medium, electromagnetic signals via air, optical signals via optical waveguides, and the like.

The machine readable instructions may comprise logic or an algorithm written in any programming language of any generation (e.g., 1GL, 2GL, 3GL, 4GL, or 5GL) such as, for example, machine language that may be directly executed by the at least one processor 12, or assembly language, object-oriented programming (OOP), scripting languages, microcode, etc., that may be compiled or assembled into machine readable instructions and stored on a machine readable medium. Alternatively or additionally, the at least one processor 12 may comprise hardware encoded with the machine readable instructions, i.e., the logic or algorithm may be written in a hardware description language (HDL), such as implemented via either a field-programmable gate array (FPGA) configuration or an application-specific integrated circuit (ASIC), and/or their equivalents.

As depicted in FIG. 1, the capacitive switching system 10 generally comprises a communication path 14 that communicably couples the capacitive switches 100, the at least one processor 12 and the memory 16. The communication path 14 is a data exchange medium that provides data interconnectivity between various components. The communication path 14 may comprise a conductive material that permits the transmission of electrical data signals to various interconnected components. Each of the components may be operatively coupled to one another, i.e., the components can operate as nodes that may send and/or receive messages to perform actions synchronously and/or cooperatively.

In one embodiment, the communication path 14 can be a communication bus that provides a network for linking multiple components and allowing each module to communicate with any other component, such as for example a LIN bus, a CAN bus, a VAN bus, and the like. In another embodiment, the communication path 14 may comprise one or more individual wires that interconnect various components. In further embodiments, the communication path 14 may be a transmissive media such as air for transmitting data wirelessly or, alternatively, an optical waveguide.

Referring again to FIG. 2, the capacitive switch 20 has a capacitance that is dependent upon the energized conductor 26. Specifically, the energized conductor 26 may be supplied with electrical energy such that electrical charge is distributed on the energized conductor 26. When the capacitive switch 20 comprises an energized conductor 26 and a second conductor 28, the capacitance of the capacitive switch 20 depends upon the distribution of the primary electric field 32, which is located between the energized conductor 26 and the second conductor 28 and the fringe electric field 34, which travels around the edges of the energized conductor 26 and the second conductor 28.

Figure 3:
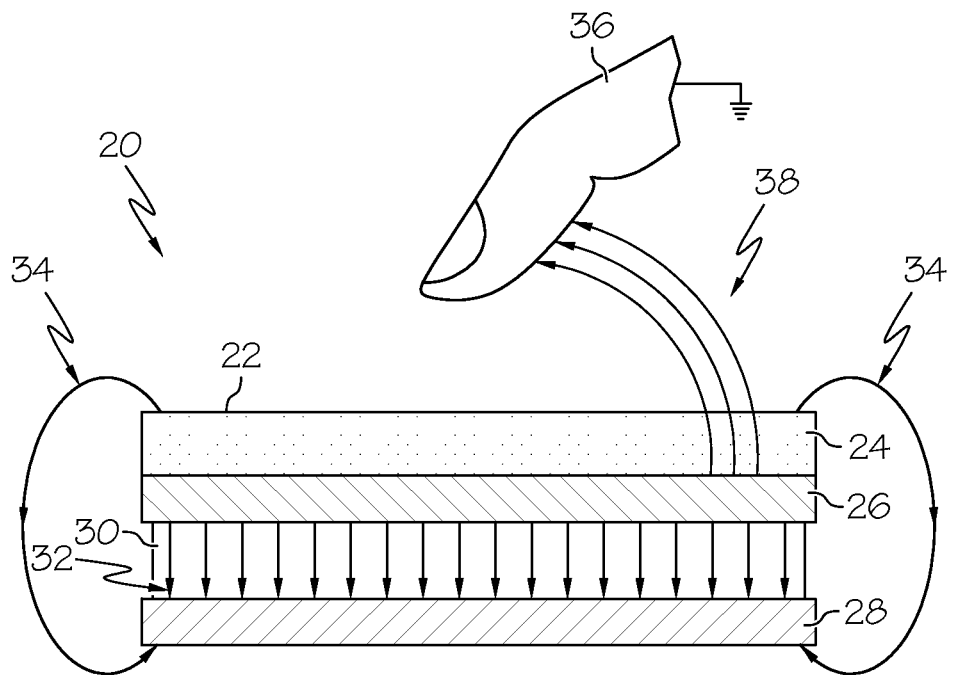
FIG. 3 schematically depicts a capacitive switch according to one or more embodiments shown and described herein.

Referring collectively to FIGS. 2 and 3, the capacitance of the capacitive switch 20 may be altered by placing an object 36 adjacent to or in contact with the activation surface 22 of the capacitive switch 20. While not intending to be bound to any theory, it is believed that the majority of the electric field generated by the energized conductor 26 is concentrated in the primary electric field 32 and a relatively small portion of the electric field generated by the energized conductor 26 is concentrated in the fringe electric field 34. As depicted in FIG. 3, when an object 36 interferes with the fringe electric field 34, a shunt electric field 38 is generated between the energized conductor 26 and the object 36. Accordingly, the distribution of the primary electric field 32 and the fringe electric field 34 is altered by the shunt electric field 38. As noted above, the capacitance of the capacitive switch, which may be measured with respect to the energized conductor 26 and a second conductor 28, is altered. The resultant change in capacitance can be detected by the at least one processor 12 (FIG. 1) and transformed into a control signal.

The capacitance of the capacitive switch 20 may also depend upon the dielectric constant of the dielectric region 24 and/or the second dielectric region 30, the distance between the energized conductor 26 and the second conductor 28 and the area of the energized conductor 26 and/or the area of the second conductor 28. Generally, the dielectric constant of the dielectric region 24 and/or the second dielectric region 30 remains substantially constant during the operation of the capacitive switch 20. However, it is noted that the capacitance of the capacitive switches described herein may be altered by a change in dielectric constant. Moreover, it is noted that, while the capacitive switch 20 is depicted in FIGS. 2 and 3 as having a substantially constant distance between conductors having a substantially constant area, the capacitance of the capacitive switches described herein may be altered by changing the distance between conductors and/or changing the area of the conductors.

For example, the capacitance of a capacitive switch may be measured with respect to only one conductor (i.e., a device without the second conductor) with the second conductor supplied by actuation (e.g., a finger or stylus). It is further noted that the terms "actuate" or "actuation" are used herein to describe the alteration of the capacitance of a capacitive switch by placing an object adjacent to or in contact with the activation surface 22 of the capacitive switch 20.

Figure 4:
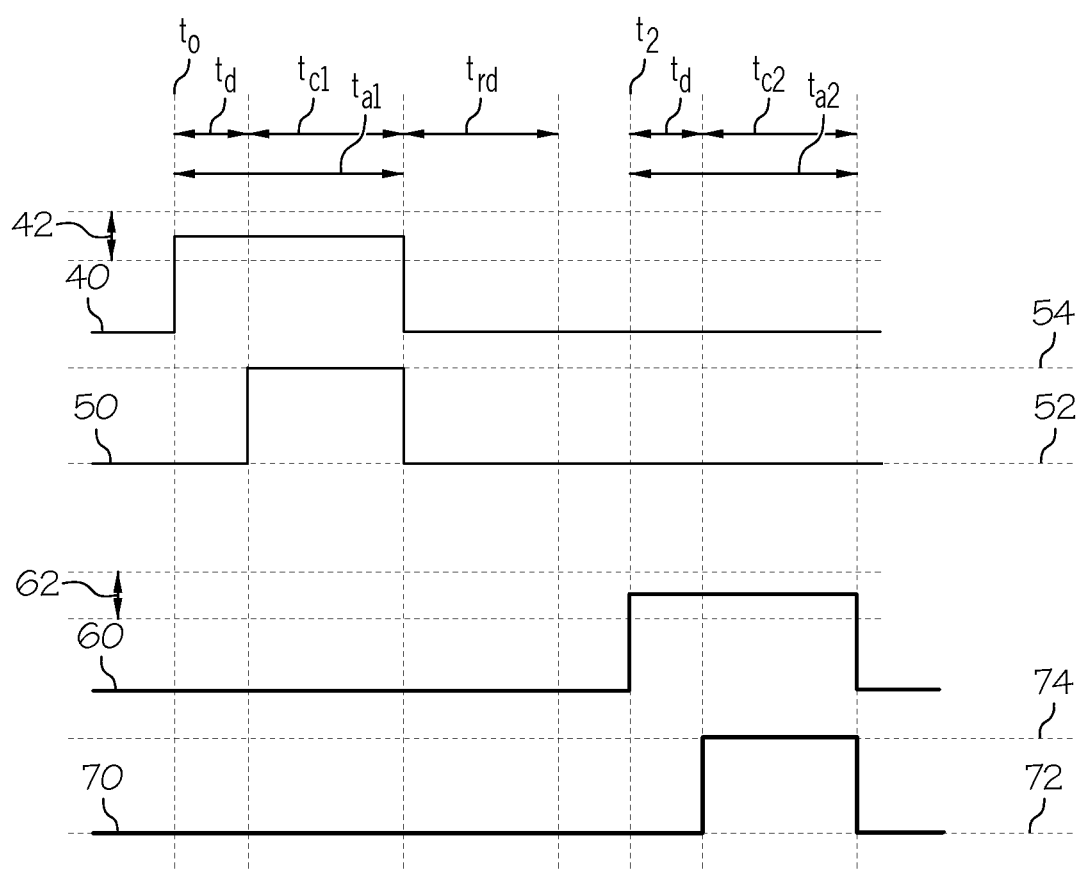
FIG. 4 graphically depicts a capacitive signal and a control signal according to one or more embodiments shown and described herein.

Referring collectively to FIGS. 1 and 4, the at least one processor may execute machine readable instructions to transform capacitance values into a control signal. For example, the at least one processor 12 may receive a first capacitance 40 indicative of the actuation of a first capacitive switch 102 of the capacitive switches 100. Specifically, the first capacitive switch 102 may be configured such that when the value of the first capacitance 40 is within a first activation range 42, the first capacitance 40 indicates that the first capacitive switch 102 is actuated. Also, the first capacitive switch 102 may be configured such that when the value of the first capacitance 40 is outside of the first activation range 42, the first capacitance 40 indicates that the first capacitive switch 102 is not actuated.

Additionally, the at least one processor 12 may receive a second capacitance 60 indicative of the actuation of a second capacitive switch 104 of the capacitive switches 100. The second capacitive switch 104 may be configured such that when the value of the second capacitance 60 is within a second activation range 62, the second capacitance 60 indicates that the second capacitive switch 104 is actuated. The second capacitive switch 104 may be configured such that when the value of the second capacitance 60 is outside of the second activation range 62, the second capacitance 60 indicates that the second capacitive switch 104 is not actuated. It is noted that, while the first activation range 42 and the second activation range 62 are depicted in FIG. 4 as indicating that the actuated capacitance is greater than the not actuated capacitance, the actuated capacitance may be greater than or less than the not actuated capacitance.

At an initial time $t_0$ the value of the first capacitance 40 may change from being outside of the first activation range 42 to being inside of the first activation range 42. Although the first capacitance 40 indicates that the first capacitive switch 102 is actuated, the at least one processor 12 may apply a debounce delay $t_d$ before transitioning the first control signal 50 from a first inactive state 52 to a first active state 54. The debounce delay $t_d$ may be utilized to mitigate the alteration of the first control signal 50 based upon noise of the first capacitance 40. Specifically, the value of the first capacitance 40 may fluctuate due to a disturbing energy source (e.g., thermal energy, electromagnetic radiation, etc.) when the first capacitive switch 102 is not actuated. However, such fluctuations generally are of a relatively short duration compared to the actuation of a switch. Thus, the at least one processor 12 may require that the value of the first capacitance 40 remain within the first activation range throughout the entire debounce delay $t_d$ before changing the first control signal 50 to the first active state 54. In one embodiment, the debounce delay $t_d$ may be based upon the sampling rate of the first capacitance 40. For example, the debounce delay $t_d$ may be a fixed number of sampling cycles (e.g., clock cycles) such as, for example, from about 1 cycle to about 20 cycles or from about 2 cycles to about 5 cycles.

The first capacitive switch 102 may remain actuated through time $t_{a1}$ and cause the value of the first capacitance 40 to remain within the first activation range 42 throughout time $t_{a1}$. Upon transitioning the first capacitive switch 102 to a not actuated state, the value of the first capacitance 40 transitions from being within the first activation range 42 to being outside of the first activation range 42. Accordingly, the at least one processor 12 changes the first control signal 50 from the first active state 54 to the first inactive state 52. Thus, while the first capacitive switch 102 is actuated from time $t_{a1}$, the first control signal 50 is in the first active state for a time $t_{c1}$, where $t_{a1}=t_d-t_d$. Additionally, it is noted that, while not depicted in FIGS. 4-6, a debounce delay $t_d$ may be applied to the transition of the first control signal 50 from the first active state 54 to the first inactive state 52.

The at least one processor 12 may activate a rejection delay $t_{rd}$ after the activation of the first capacitive switch 102. In one embodiment, the at least one processor 12 may activate the rejection delay $t_{rd}$ when the value of the first capacitance 40 transitions from being within the first activation range 42 to being outside of the first activation range 42, i.e, at time $t_0+t_{a1}$. The rejection delay $t_{rd}$ may remain active for a predetermined time period after being activated. While the rejection delay $t_{rd}$ is activated a second control signal 70 may be prevented from transitioning from a second inactive state 72 to a second active state 74. The predetermined time period may be any time sufficient to mitigate unintentional actuations such as, for example, from about 0 ms to about 900 ms, greater than about 0 ms and less than about 500 ms, or from about 100 ms to about 400 ms. As is described in greater detail below, the predetermined time period may be altered depending upon the relationship between the first capacitive switch 102 and the second capacitive switch 104 when the second control signal 70 corresponds to the second capacitive switch 104 of the capacitive switches 100.

Still referring to FIGS. 1 and 4, the second capacitive switch 104 of the capacitive switches 100 may be actuated at a time $t_2$, where $t_2 > t_0 + t_{a1} + t_{rd}$. Accordingly, the second control signal 70 is unaffected by the rejection delay $t_{rd}$ and operates in a manner similar to the first control signal 50. Specifically, the at least one processor 100 may detect that the value of the second capacitance 60 transitions from being outside of the second activation range 62 to being within the second activation range 42. The at least one processor may then apply the debounce delay $t_d$ and change the second control signal 70 from the second not active state 72 to the second active state 74. Upon the transition of the second capacitive switch 104 to the not actuated state, the value of the second capacitance 60 transitions from being within the second activation range 62 to being outside of the second activation range 62. The at least one processor 12 may then change the second control signal 70 from the second active state 74 to the second inactive state 72. Thus, while the second capacitive switch 104 is actuated for time $t_{a2}$, the second control signal 70 is in the first active state for a time $t_{c2}$, where $t_{c2} = t_{a2} - t_d$.

Figure 5:
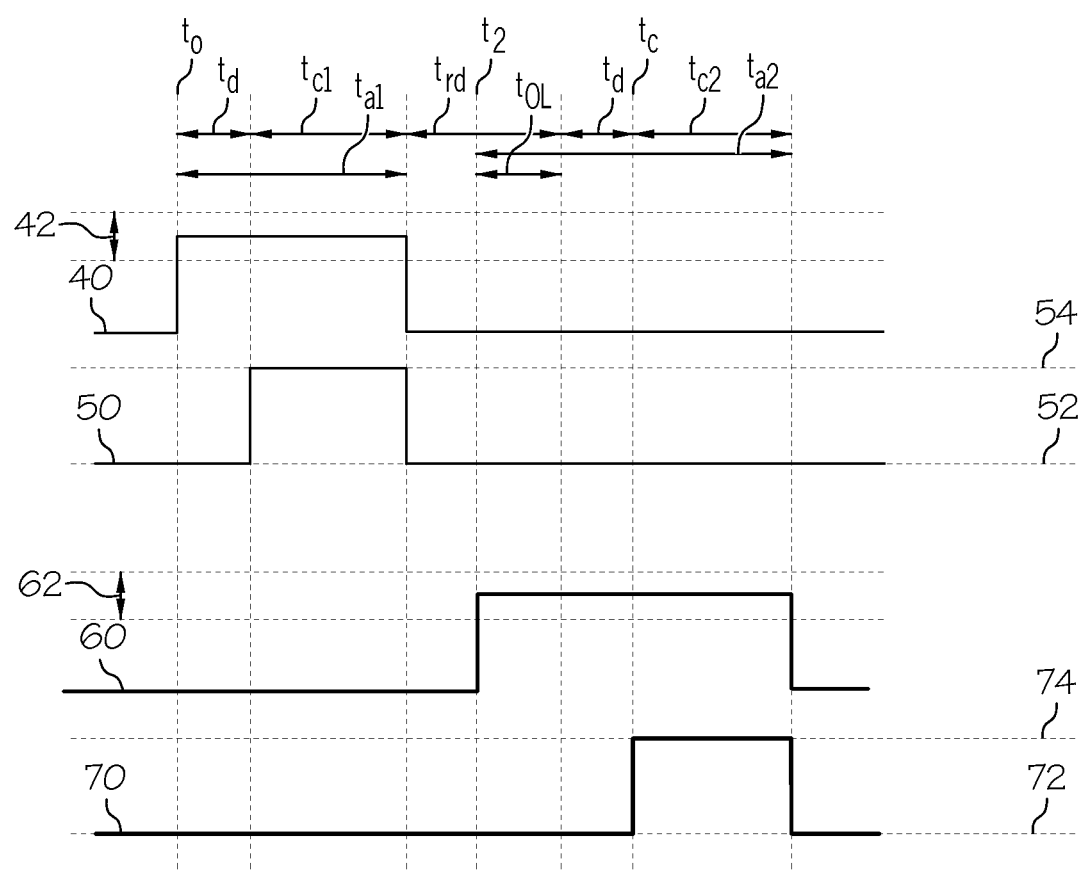
FIG. 5 graphically depicts a capacitive signal and a control signal according to one or more embodiments shown and described herein.
Figure 6:
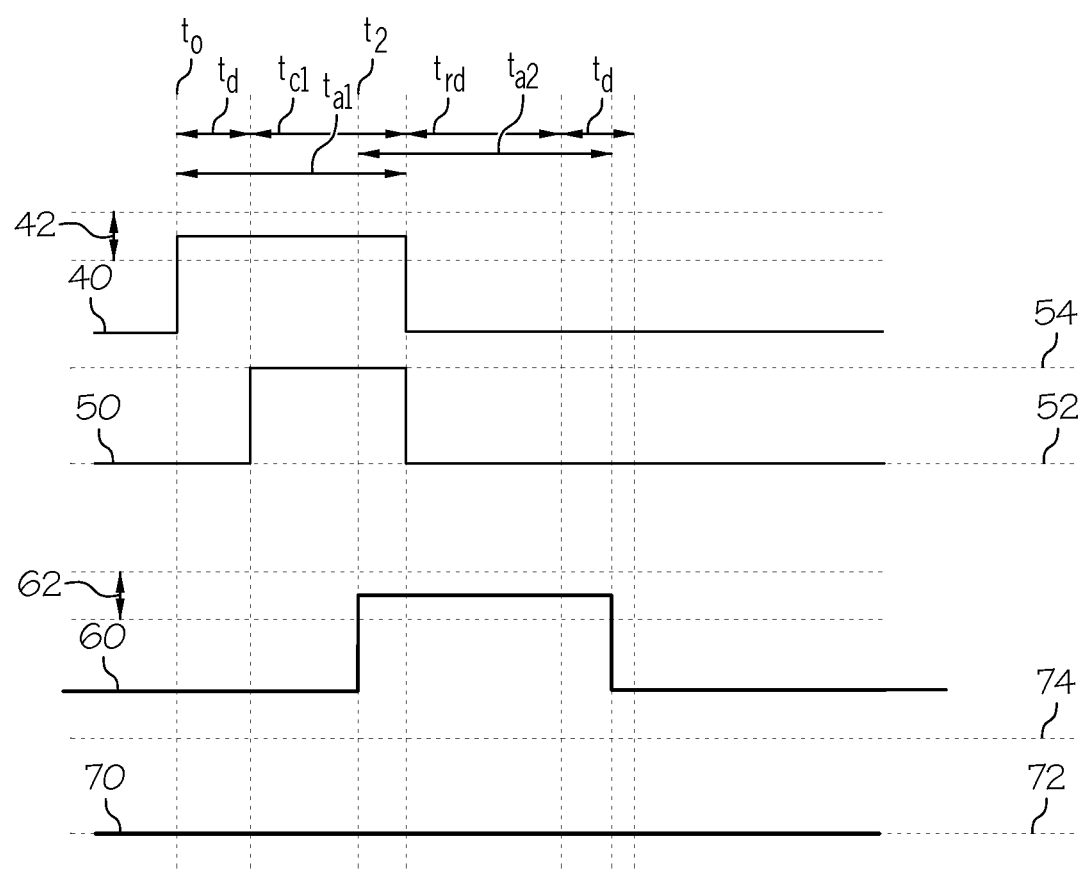
FIG. 6 graphically depicts a capacitive signal and a control signal according to one or more embodiments shown and described herein.

Referring collectively to FIGS. 4-6, the actuation of the first capacitive switch 102 and the corresponding first capacitance 40 and first control signal 50 are depicted in each of the figures as operating in a substantially identical manner. Accordingly, the description of the operation of the first capacitive switch 102 and the corresponding first capacitance 40 and first control signal 50 from above will be omitted for brevity.

In FIG. 5, the second capacitive switch 104 of the capacitive switches 100 is depicted as being actuated in a manner similar to the actuation of the second capacitive switch 104 depicted in FIG. 4. Accordingly, the operation of the second capacitive switch 104 and the corresponding second capacitance 60 and second control signal 70 is substantially similar to the operation described above.

Referring collectively to FIGS. 1, 4 and 5, the rejection delay $t_{rd}$ may alter the duration of time that the second control signal 70 is actuated. For example, the second control signal 70 may be shortened when the actuation of the second capacitive switch 104 overlaps with the rejection delay $t_{rd}$. Specifically, the second capacitive switch 104 is depicted in FIG. 4 as being actuated at a time $t_2$, where $t_2 > t_0 + t_{a1} + t_{rd}$. The second capacitive switch 104 is depicted, in FIG. 5, as being actuated at a time $t_2$, where $t_0 + t_{a1} < t_2 < t_0 + t_{a1} + t_{rd}$. Accordingly, the time $t_{a2}$ that the second capacitive switch 104 is activated overlaps with the rejection delay $t_{rd}$ for an overlap time $t_{OL}$ as depicted in FIG. 5. Because of this overlap, the second control signal 70 is prevented by the at least one processor 12 from transitioning from a second inactive state 72 to a second active state 74 while the rejection delay $t_{rd}$ is activated. Accordingly, the state of the second control signal 70 is not altered until after the rejection delay $t_{rd}$ is deactivated. Specifically, the control signal 70 is transitioned from the second inactive state 72 to the second active state 74 at a time $t_c$, where $t_c = t_2 + t_{OL} + t_d$. In some embodiments, the debounce delay $t_d$ may be disabled when the rejection delay $t_{rd}$ delays the alteration of the second control signal 70.

In FIG. 6, the second capacitive switch 104 of the capacitive switches 100 is depicted as being actuated in a manner similar to the actuation depicted in FIG. 4. Accordingly, the operation of the second capacitive switch 104 and the corresponding second capacitance 60 and second control signal 70 is substantially similar to operation described above.

Referring collectively to FIGS. 1, 4 and 6, the rejection delay $t_{rd}$ may prevent the second control signal 70 from being actuated. For example, the second control signal 70 may be prevented from becoming actuated when the second capacitive switch 104 is actuated and released before the expiration of the rejection delay $t_{rd}$. Specifically, the second capacitive switch 104 is depicted in FIG. 4 as being actuated at a time $t_2$, where $t_2 > t_0 + t_{a1} + t_{rd}$. The second capacitive switch 104 is depicted, in FIG. 6, as being actuated at a time $t_2$, where $t_2 < t_0 + t_{a1} + t_{rd}$ and $t_2 + t_{a2} < t_0 + t_{a1} + t_{rd} + t_d$. As depicted in FIG. 6, the second capacitive switch 104 transitions from being actuated to being not actuated before the expiration of the debounce delay $t_d$ and the rejection delay $t_{rd}$. Since the second control signal 70 is prevented by the at least one processor 12 from transitioning from the second inactive state 72 to the second active state 74 while the rejection delay $t_{rd}$ is activated, the second control signal 70 remains in the second inactive state 72 even though the second capacitive switch 104 is actuated for time $t_{a2}$.

Figure 7:
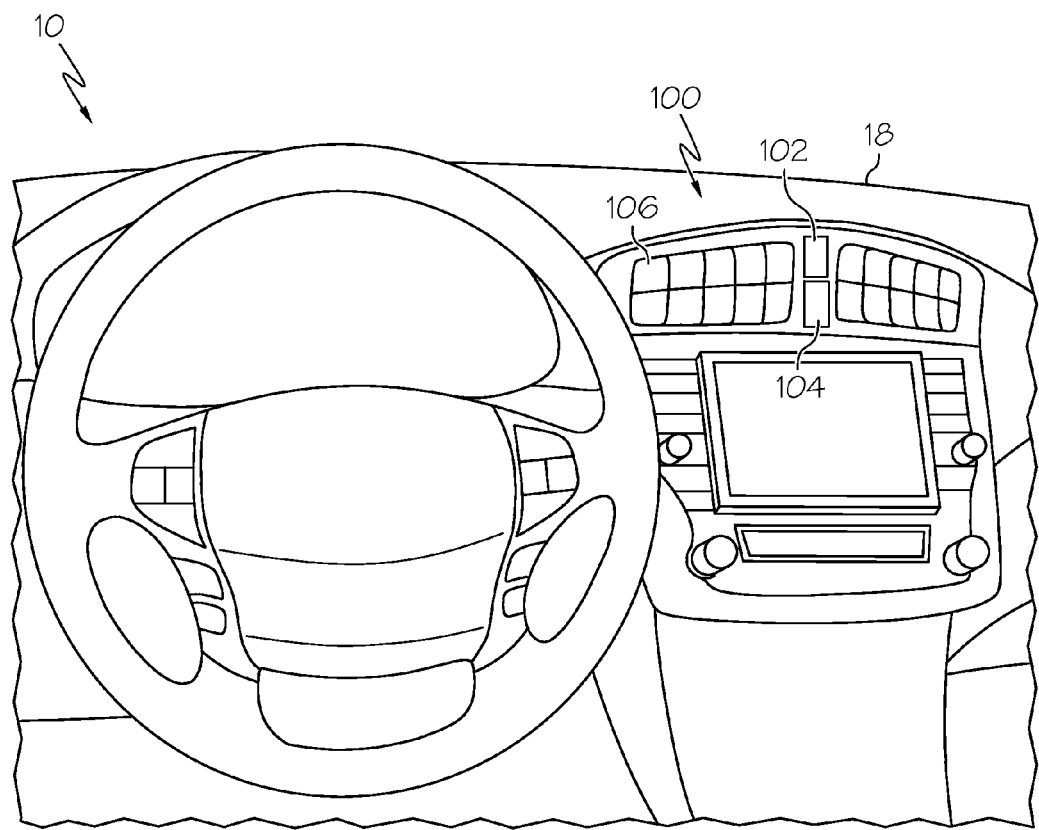
FIG. 7 schematically depicts a capacitive switching system according to one or more embodiments shown and described herein.

As is noted above, the predetermined time period of the rejection delay $t_{rd}$ may be varied depending upon the relationship between the capacitive switches 100. Generally, the predetermined time period is scaled according to the likelihood of an unintended actuation, i.e., an actual actuation that was not desired by the user. Referring collectively to FIGS. 1 and 7, the capacitive switching system 10 may be located within a vehicle 18. The likelihood of unintended actuation may be determined by measuring the arm travel of an occupant of the vehicle from a reference point within the vehicle such as, for example, a seat or a shoulder point. Accordingly, the order of actuation of the capacitive switches 100 and the location of a later actuated switch with respect to an earlier actuated switch affects the likelihood of unintended actuation.

Specifically, a first capacitive switch 102, a second capacitive switch 104, and a third capacitive switch 106 may be located within a vehicle 18. The first capacitive switch is located relatively close to and above the second capacitive switch 104. The first capacitive switch is located relatively far from the third capacitive switch 106. Accordingly, when the first capacitive switch 102 is actuated, the at least one processor 12 may store information in the memory 16 that indicates that the first capacitive switch 102 was actuated. If the second capacitive switch 104 is actuated after the first capacitive switch 102, the at least one processor 12 may set the predetermined time period to a relatively short amount of time. If the third capacitive switch 106 is actuated after the first capacitive switch 102, the at least one processor 12 may set the predetermined time period to a relatively long amount of time. In one embodiment, a plurality of predetermined time periods may be stored in memory 16 in a look-up table, wherein each sequence of possible actuations has an associated time value. For example, the at least one processor 12 may determine a first actuated switch and a subsequently actuated switch. The at least one processor 12 may utilize the first actuated switch and the subsequently actuated switch as input for the look-up table, and retrieve a value corresponding to the associated predetermined time period.

It should now be understood that switching systems and methods for applying a rejection delay, described herein, can be utilized to mitigate the effects of an unintended actuation of a switch such as, a capacitive switch or a mechanically actuated electrical switch. As opposed to a debounce delay which mitigates the misinterpretation of noise as an actuation, the rejection delay does provides a mechanism to reduce likelihood that an undesired control signal is generated from an unintentionally and actually actuated switch. For example, a switch that increases the temperature of the vehicle may be located adjacent to a switch that decreases the temperature of the vehicle. A driver may use her hand to intentionally actuate the switch that increases the temperature. As the driver retracts her hand, the hand may, without the driver's knowledge, actuate the switch that decreases the temperature. The rejection delay, which may be activated after the actuation of the switch that increases the temperature, can prevent the switch that decreases the temperature from controlling the heating and cooling component of the vehicle. Thus, the rejection delay may improve driver satisfaction by performing the intended function and not performing the unintended function.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A capacitive switching system comprising:
   a plurality of capacitive switches, wherein each of the capacitive switches comprises an activation surface offset from an energized conductor by a dielectric region and a capacitance that is dependent upon an electric field generated by the energized conductor; and
   at least one processor in electrical communication with the capacitive switches, wherein the at least one processor executes machine readable instructions to:
      transform a change in the capacitance of one of the capacitive switches into a first control signal indicative of a first active state, wherein a debounce delay is applied after the change in the capacitance of the one of the capacitive switches and prior to transforming the change in the capacitance of the one of the capacitive switches into the first control signal indicative of the first active state;
      activate a rejection delay after the change in the capacitance of the one of the capacitive switches, wherein the rejection delay remains activated for a predetermined time period, and wherein the rejection delay is activated when the capacitance of the one of the capacitive switches indicates that the one of the capacitive switches is transitioned from an actuated state to a not actuated state; and
      prevent a second control signal from indicating a second active state while the rejection delay is activated, wherein the second control signal corresponds to another of the capacitive switches.

2. The capacitive switching system of claim 1, wherein each of the capacitive switches comprises a second conductor that is offset from the energized conductor by a second dielectric region.

3. The capacitive switching system of claim 1, wherein the energized conductor comprises a shaped conductive trace.

4. The capacitive switching system of claim 1, wherein the activation surface comprises a dielectric material.

5. The capacitive switching system of claim 4, wherein the activation surface comprises a printed graphic.

6. The capacitive switching system of claim 1, wherein the capacitance of the one of the capacitive switches changes when an object is adjacent to or in contact with the activation surface of the one of the capacitive switches.

7. The capacitive switching system of claim 1, wherein the debounce delay is from about 2 cycles to about 5 cycles.

8. The capacitive switching system of claim 1, wherein the at least one processor executes machine readable instructions to set the predetermined time period based upon a relative distance of the one of the capacitive switches and the another of the capacitive switches from a reference point.

9. The capacitive switching system of claim 1, wherein the predetermined time period is greater than about 0 ms and less than about 500 ms.

10. A method for applying a rejection delay, the method comprising:
    detecting, automatically with at least one processor, a capacitance of each of a plurality of capacitive switches, wherein each of the capacitive switches comprises an activation surface offset from an energized conductor by a dielectric region such that the capacitance is dependent upon the energized conductor;
    transforming a change in the capacitance of one of the capacitive switches into a first control signal indicative of a first active state;
    applying a debounce delay prior to transforming the change in the capacitance of the one of the capacitive switches into the first control signal indicative of the first active state:
    activating the rejection delay after the change in the capacitance of the one of the capacitive switches, wherein the rejection delay remains activated for a predetermined time period, and wherein the rejection delay is activated when the capacitance of the one of the capacitive switches indicates that the one of the capacitive switches is transitioned from an actuated state to a not actuated state; and
    preventing a second control signal from indicating a second active state while the rejection delay is activated, wherein the second control signal corresponds to another of the capacitive switches.

11. The method of claim 10, wherein the debounce delay is from about 2 cycles to about 5 cycles.

12. The method of claim 10, wherein the predetermined time period is greater than about 0 ms and less than about 500 ms.

13. The method of claim 10, further comprising setting the predetermined time period based upon a relative distance of the one of the capacitive switches and the another of the capacitive switches from a reference point.

14. The method of claim 13, further comprising providing a look-up table, wherein time values are associated with sequences of the capacitive switches in the look-up table and the predetermined time period is set based upon one of the time values of the look-up table.

15. A switching system comprising:
    a first switch that generates a first signal indicative of the actuation of the first switch;
    a second switch that generates a second signal indicative of the actuation of the second switch; and
    at least one processor in electrical communication with the first switch and the second switch, wherein the at least one processor executes machine readable instructions to:

transform the first signal of the first switch into a first control signal having a first active state and a first inactive state, wherein the first control signal is in the first active state when the first signal of the first switch is within a first activation range and the first control signal is in the first inactive state when the first signal of the first switch is outside of the first activation range;

apply a debounce delay when the first signal of the first switch transitions from being outside of the first activation range to being within the first activation range and prior to transforming the first signal of the first switch into the first control signal indicative of the first active state;

activate a rejection delay when the first signal of the first switch transitions from being outside of the first activation range to being within the first activation range;

deactivate the rejection delay a predetermined time period after the rejection delay was activated; and transform the second signal of the second switch into a second control signal having a second active state and a second inactive state, wherein the second control signal is in the second active state when the second signal of the second switch is within a second activation range and the rejection delay is deactivated, and the second control signal is in the second inactive state when the second signal of the second switch is outside of the first activation range and when the rejection delay is activated.

16. The switching system of claim 15, wherein the first switch comprises an activation surface offset from an energized conductor by a dielectric region, wherein the first signal of the first switch is dependent upon an electric field generated by the energized conductor.

* * * * *